(12) United States Patent
Wong et al.

(10) Patent No.: US 7,825,902 B2
(45) Date of Patent: Nov. 2, 2010

(54) CONTROLLER, SYSTEM AND METHOD FOR IDENTIFYING A NUMBER OF INTERACTIONS WITH A COMPUTER INPUT AREA

(75) Inventors: Chee-Heng Wong, Singapore (SG); Kai-Koon Lee, Singapore (SG); Wee-Sin Tan, Singapore (SG); Deng-Peng Chen, Singapore (SG)

(73) Assignee: Avego Technologies General IP (Singapore) Pte. Ltd., Singapore (SG)

( * ) Notice: Subject to any disclaimer, the term of this patent is extended or adjusted under 35 U.S.C. 154(b) by 955 days.

(21) Appl. No.: 11/096,064

(22) Filed: Mar. 31, 2005

(65) Prior Publication Data
US 2006/0221062 A1 Oct. 5, 2006

(51) Int. Cl.
*G09G 5/00* (2006.01)

(52) U.S. Cl. .................. 345/173; 345/175; 345/179; 178/18.01; 178/20.01

(58) Field of Classification Search .................. 345/173, 345/175, 179; 178/18.01, 20.01
See application file for complete search history.

(56) References Cited

U.S. PATENT DOCUMENTS

| | | | |
|---|---|---|---|
| 4,709,228 A | 11/1987 | Hucking et al. | |
| 4,945,504 A | 7/1990 | Nakama et al. | |
| 5,136,156 A * | 8/1992 | Nounen et al. | 250/221 |
| 6,111,948 A * | 8/2000 | Lygas | 379/368 |
| 6,239,389 B1 | 5/2001 | Allen et al. | |
| 6,333,735 B1 | 12/2001 | Anvekar | |
| 6,690,363 B2 * | 2/2004 | Newton | 345/173 |
| 6,707,448 B1 * | 3/2004 | Kunimatsu et al. | 345/173 |
| 6,961,051 B2 | 11/2005 | Weindorf et al. | |
| 7,199,788 B2 | 4/2007 | Ise et al. | |
| 2005/0017959 A1 * | 1/2005 | Kraus et al. | 345/173 |
| 2007/0018970 A1 * | 1/2007 | Tabasso et al. | 345/184 |

FOREIGN PATENT DOCUMENTS

| | | |
|---|---|---|
| GB | 2133745 A | 1/1984 |
| JP | 8016307 | 1/1996 |
| JP | 10-228350 * | 8/1998 |
| JP | 2000-284899 * | 10/2000 |
| WO | WO-2005/114369 | 12/2005 |

OTHER PUBLICATIONS

U.K. Search Report dated Jun. 9, 2006 issued by U.K. Patent Office Examiner Ben Buchanan.

\* cited by examiner

*Primary Examiner*—Richard Hjerpe
*Assistant Examiner*—Leonid Shapiro

(57) ABSTRACT

Disclosed is a method for identifying a number of interactions with a computer input area defined by at least first and second intersecting sets of detection paths. First, indications of which of the detection paths are affected by the interactions are received. Then, for each of the detection path sets, the set's indications of affected detection paths are parsed to identify up to N extents of adjacent, affected detection paths (N≧2). A controller having logic to implement the method, and a system incorporating a control system that implements the method, are also disclosed.

7 Claims, 3 Drawing Sheets

CONTROLLER, SYSTEM AND METHOD FOR IDENTIFYING A NUMBER OF INTERACTIONS WITH A COMPUTER INPUT AREA

BACKGROUND

Computers may receive input in a variety of ways, including, by means of a keyboard, mouse or computer input area. Computer input areas generally take one of two forms—i.e., that of a touch pad comprising discrete touch sensors (e.g., a touch pad comprising an array of capacitive sensors), or that of a touch pad or other perimeter sensor comprising sets of intersecting detection paths (e.g., a touch pad comprising first and second intersecting sets of optical detection paths).

Touch pads that overlay display screens such as liquid crystal displays (LCDs) are becoming more and more popular in a variety of devices, including personal digital assistants (PDAs), mobile phones, automated teller machines (ATMs), and point-of-sale terminals.

SUMMARY OF THE INVENTION

In one embodiment, a method for identifying a number of interactions with a computer input area defined by at least first and second intersecting sets of detection paths comprises 1) receiving indications of which of the detection paths are affected by said interactions, and 2) for each of the detection path sets, parsing the set's indications of affected detection paths to identify up to N extents of adjacent, affected detection paths (wherein $N \geq 2$).

In another embodiment, a controller for identifying a number of interactions with a computer input area defined by at least first and second intersecting sets of detections path comprises 1) an interface to receive indications of which of the detection paths are affected by said interactions, and 2) logic to, for each of the detection path sets, parse the set's indications of affected detection paths to identify up to N extents of adjacent, affected detection paths (wherein $N \geq 2$).

In yet another embodiment, a system comprises first and second intersecting sets of touch detection paths and a control system. The control system is provided to identify a number of interactions with the touch detection paths and comprises 1) an interface to receive indications of which touch detection paths are affected by said interactions, and 2) logic to, for each of the detection path sets, parse the set's indications of affected detection paths to identify up to N extents of adjacent, affected detection paths (wherein $N \geq 2$).

Other embodiments are also disclosed.

BRIEF DESCRIPTION OF THE DRAWINGS

Illustrative embodiments of the invention are illustrated in the drawings, in which.

DETAILED DESCRIPTION

Computers may receive input in a variety of ways, including, by means of a keyboard, mouse or computer input area. Computer input areas generally take one of two forms—i.e., that of a touch pad comprising discrete touch sensors (e.g., a touch pad comprising an array of capacitive sensors), or that of a touch pad or other perimeter sensor comprising sets of intersecting detection paths (e.g., a touch pad comprising first and second intersecting sets of optical detection paths).

Figure 1:
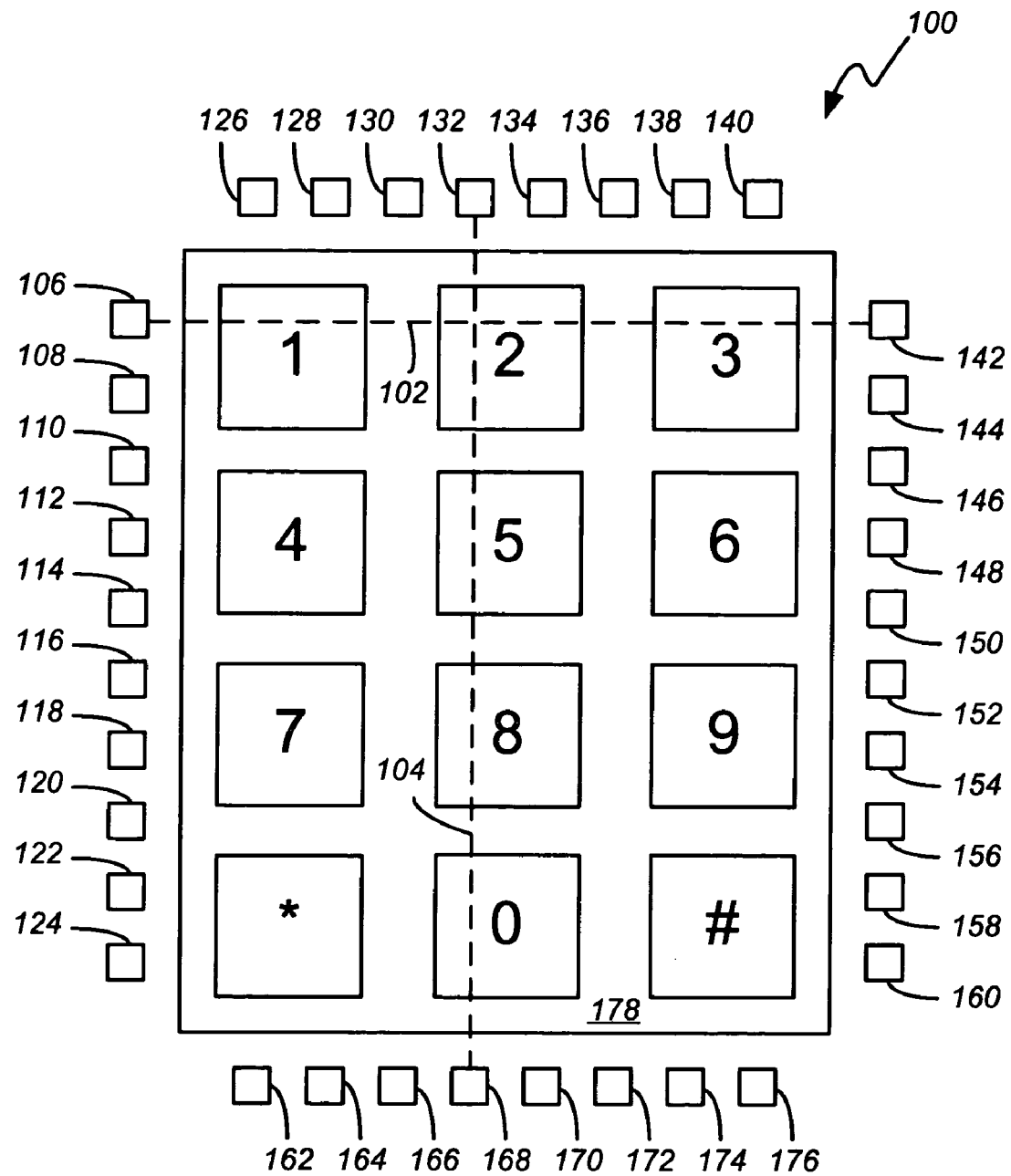
FIG. 1 illustrates an exemplary computer input area.

FIG. 1 illustrates an exemplary computer input area 100. By way of example, the computer input area 100 is shown to be an optical touch pad comprising first and second intersecting sets of optical detection paths (e.g., paths 102, 104). Each of the detection paths (e.g., 102) is bounded by a light source (e.g., a light emitting diode (LED) 106) positioned at one edge of the touch pad 100, and an optical detector (e.g., 142) positioned at an opposite edge of the touch pad. In use, each light source 106-140 illuminates its corresponding optical detector 142-176. If a user touches the touch pad 100 (e.g., using a finger or stylus), their touch blocks the transmission of light between one or more of the source/detector pairs, and an absence of light is registered by one or more of the optical detectors 142-176.

In FIG. 1, the touch pad 100 has a generally rectangular input area, and the sources 106-140 and detectors 142-176 of each detection path set are arranged in rows or columns about the edges of the touch pad 100. However, touch pads can also take other shapes and forms. For example, a touch pad could be circular or elliptical-shaped, with its light sources and detectors not necessarily being arranged along perpendicular axes, but instead being arranged in arcs, staggered rows or other patterns. Sources and detectors may also be mingled. That is, for example, sources and detectors could be distributed uniformly and alternately around a touch pad, thereby causing light to be transmitted across the touch pad from all of its edges.

It is also noted that the detection paths (e.g., 102, 104) of a touch pad 100 need not be parallel or perpendicular to one another. For example, a plurality of light sources could be positioned more closely than their corresponding optical detectors (or vice versa), or a plurality of optical detectors could share a common light source.

By way of example, the surface 178 of a touch pad 100 may be plastic or glass. In some cases, the surface 178 may be opaque, with or without indicia thereon. In other cases, the surface 178 may be transparent, thereby allowing a display screen (e.g., a liquid crystal display (LCD)) to be positioned behind the surface 178. In FIG. 1, the touch pad 100 is overlaid on a display screen that displays function keys (e.g., 1-9, * and #) as visual cues of where a user might touch the touch pad 100.

In still other embodiments, a touch pad could comprise something other than optical detection paths, such as capacitive detection paths.

Having briefly summarized a plurality of different computer input areas having at least first and second intersecting sets of detection paths, including the optical touch pad 100 shown in FIG. 1, an exemplary method for identifying a number of interactions with such a computer input area will now be described.

Figure 2:
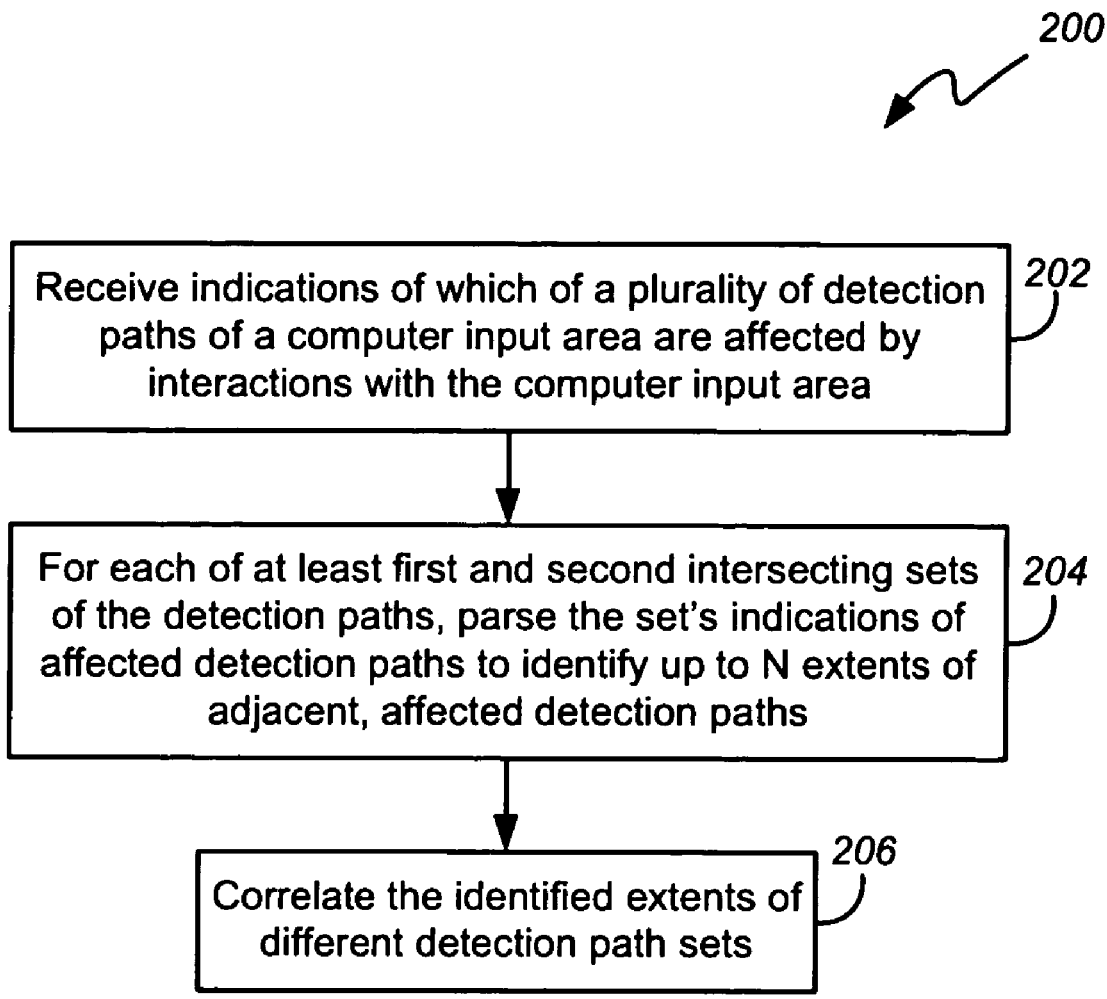
FIG. 2 illustrates an exemplary method for identifying a number of interactions with a computer input area such as that which is shown in FIG. 1.

As shown in FIG. 2, a method 200 for identifying a number of interactions with a computer input area 100 comprises 1) receiving 202 indications of which of a plurality of detection paths are affected by the interactions, and 2) for each of at least first and second intersecting sets of the detection paths, parsing 204 the set's indications of affected detection paths to identify up to N extents of adjacent, affected detection paths (wherein $N \geq 2$). Optionally, the identified extents of different detection path sets may be correlated 206. An exemplary application of the method 200 is portrayed in FIG. 3.

Figure 3:
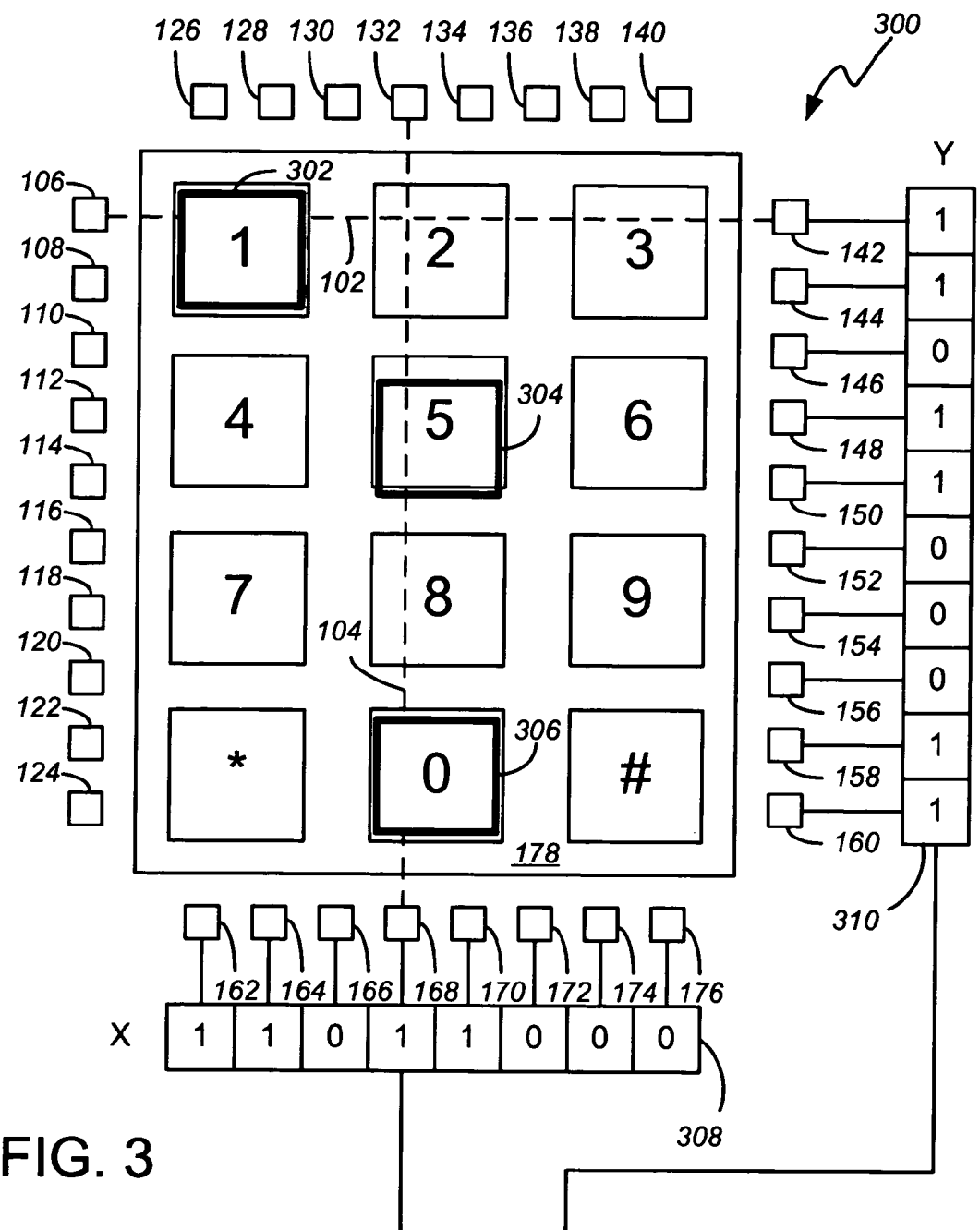
FIG. 3 illustrates one exemplary application of the FIG. 2 method.

FIG. 3 illustrates an exemplary set of three touches 302, 304, 306 on an optical touch pad 300. As a result of the touches 302-306, four detection paths on one axis (the x-axis), and six detections paths on another axis (the y-axis), are blocked. By way of example, one or more storage means, such as a pair of registers 308, 310 corresponding to the axes of the touch pad 300, may be used to store indications of which detection paths are affected by a user's touches. In one embodiment, each register position is implemented by a latch that is attached to the output of a corresponding optical detector 142-176. If an optical detector receives the light transmitted by its corresponding light source, its corresponding latch stores a logic "0". Otherwise, its latch stores a logic "1".

In some embodiments, the registers 308, 310 are configured to acquire indications of affected detection paths at substantially discrete moments in time (e.g., in sync with a clock edge). In other embodiments, the registers 308, 310 may be configured to acquire indications of affected detection paths over a period of time (e.g., over a time period defined by a pair of clock edges).

The indications stored by the registers 308, 310 may be output to (or read by) an interface of a controller 312. The controller 312 may be provided with logic to implement the method 200. Alternately, a control system comprising one or more components, and embodied partly or wholly in hardware, firmware and/or software may be used to implement the method 200.

The controller 312 comprises logic to parse the indications received from the registers 308, 310 to identify up to N extents of adjacent, affected detection paths (wherein N≧2). The number N may be fixed or programmable, and is indicative of a maximum number of touches 302-306 that can be identified by the controller 312. In the case of an integrated hardware controller, it may be desirable to fix the number N so that the controller can deterministically parse, identify and output the locations of a predetermined number of N touches. If, for example, N=3, the controller 312 would then output the locations of up to three touches. However, if only one two touches exist, the controller 312 may output the locations of only those touches that exist, and then output logic "0"s or some other default indicator to signify that other touches were not identified.

As indicated by the method 200, the locations of touches 302-306 are identified by identifying up to N extents of adjacent, affected detection paths for each of a touch pad's detection path sets (e.g., its x-axis and y-axis detection path sets). In one embodiment, the extent of a set of adjacent, affected detection paths is represented by the minimum and maximum coordinates of the extent. Thus, for example, in FIG. 3, the coordinates of the x-axis extents are (1, 2) and (4, 5), and the coordinates of the y-axis extents are (1, 2), (4, 5) and (9, 10). In one embodiment, the controller 312 merely outputs the coordinates of each of these extents (i.e., the controller may output six x-axis coordinates representing the minimum and maximum coordinates for the extents of each of the three touches 302-306, and six y-axis coordinates representing the minimum and maximum coordinates for the extents of the three touches 302-306). As previously indicated, there may be times when fewer than three extents are output for each axis—even when there are three touches, as shown in FIG. 3.

Optionally, the identified extents of affected detection path sets may be correlated. In some cases, this correlation may be dictated solely by the order in which extents of affected detection paths of different sets are identified. However, in cases where one or more touches are masked from the viewpoint of one detection path set (e.g., as with the touches 304 and 306 in FIG. 3), additional steps may need to be taken to ensure that each touch 304, 306 is defined by coordinates in both of a touch pad's axes.

In one embodiment, if a greater number of extents are identified for one set of detection paths, multiple extents of this set are correlated with ones of the extents of another detection path set, in accordance with a predetermined algorithm. The algorithm may dictate, for example, that multiple "extra" extents of one detection path set should be correlated with a single one of the extents of another detection path set, such as, by mapping all of the "extra" extents to the last identified extent of the other detection path set. Although such an algorithm may result in aliasing between different patterns and numbers of touches (i.e., different patterns and numbers of touches that map to a single set of identified extents), this is sometimes acceptable—especially when the number of touches recorded is more important than their location. However, aliasing may be minimized by prompting a touch pad user to enter touch options that are known to be distinct (i.e., touch options that are not aliases of one another).

The extents of adjacent, affected detection paths identified by the controller 312 (or a control system that otherwise implements the method 200) may be variously used to control or inform a system to which the touch pad 300 is connected. For example, the identified extents may be associated with actions to be performed by a processor. By way of example, these actions may include, for example, a key lock/unlock function, a reboot function, a power down function, or the update of a display screen over which the touch pad 300 is overlaid. In some cases, associations of actions may be undertaken by the controller 312 itself. In other cases, the associations may be undertaken by the processor, or by some intervening device. In one embodiment, associations between identified extents, and actions to be performed, may be made after first determining the centers-of-gravity of correlated extents. Touch pad interactions that would otherwise trigger more than one action can therefore be distilled down to a single "most likely" action.

What is claimed is:

1. A method of operating a touch pad, the method comprising:
providing a first set of detection paths comprising pairs of adjacent detection paths aligned in a first axial direction of the touch pad;
providing a second set of detection paths comprising pairs of adjacent detection paths aligned in a second axial direction of the touch pad, the second axial direction intersecting the first axial direction;
generating a first set of coordinates corresponding to the first axial direction, the first set of coordinates identifying at least one pair of adjacent detection paths aligned in the first axial direction that is affected by a first touch upon the touch pad;
generating a second set of coordinates corresponding to the second axial direction, the second set of coordinates identifying at least one pair of adjacent detection paths aligned in the second axial direction that is affected by the first touch upon the touch pad;
parsing the first and the second set of coordinates for identifying the first touch upon the touch pad;
further using the first set of coordinates for identifying additional pairs of adjacent detection paths aligned in the first axial direction that are affected by a second touch and a third touch upon the touch pad; and
further using the second set of coordinates for identifying additional pairs of adjacent detection paths aligned in the second axial direction that are affected by at least one of the second touch or the third touch upon the touch pad.

2. The method of claim 1, wherein the third touch is masked along the second axial direction by the second touch.

3. The method of claim 2, wherein as a result of the masking, the identified pairs of adjacent detection paths aligned in the first axial direction is greater in number than the identified pairs of adjacent detection paths aligned in the second axial direction, and further wherein the first set of coordinates is correlated with the second set of coordinates for identifying the third touch.

4. The method of claim 3, wherein the correlation comprises correlating multiple pairs from the first set of coordinates with one pair from the second set of coordinates.

5. The method of claim 4, wherein the one pair from the second set of coordinates is a last identified pair in the second set of coordinates.

6. The method of claim 1, wherein the first axial direction is a horizontal x-axis and the second axial direction is a perpendicular y-axis of the touch pad.

7. The method of claim 1, wherein the first axial direction intersects the second axial direction non-perpendicularly.

* * * * *